United States Patent
Harley et al.

(10) Patent No.: US 10,090,421 B2
(45) Date of Patent: *Oct. 2, 2018

(54) FOIL-BASED METALLIZATION OF SOLAR CELLS

(71) Applicant: SUNPOWER CORPORATION, San Jose, CA (US)

(72) Inventors: Gabriel Harley, Mountain View, CA (US); Taeseok Kim, San Jose, CA (US); Richard Hamilton Sewell, Los Altos, CA (US); Michael Morse, San Jose, CA (US); David D. Smith, Campbell, CA (US); Matthieu Moors, Braine-le-Chateau (FR); Jens-Dirk Moschner, Heverlee (BE)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/485,840

(22) Filed: Apr. 12, 2017

(65) Prior Publication Data

US 2017/0222068 A1 Aug. 3, 2017

Related U.S. Application Data

(63) Continuation of application No. 14/954,030, filed on Nov. 30, 2015, now Pat. No. 9,627,566, which is a
(Continued)

(51) Int. Cl.
*H01L 31/0224* (2006.01)
*H01L 31/0475* (2014.01)
(Continued)

(52) U.S. Cl.
CPC ...... *H01L 31/02245* (2013.01); *H01L 31/028* (2013.01); *H01L 31/0475* (2014.12); *H01L 31/0512* (2013.01)

(58) Field of Classification Search
CPC .................................................. H01L 31/0475
See application file for complete search history.

(56) References Cited

U.S. PATENT DOCUMENTS 8,003,530 B2   8/2011   Grohe et al.
8,399,331 B2   3/2013   Moslehi et al.
(Continued)

FOREIGN PATENT DOCUMENTS

CN   103518265 A   1/2014
JP   2011-066312   3/2011
(Continued)

OTHER PUBLICATIONS

International Search Report and Written Opinion from PCT/US2015/022336 dated Jun. 22, 2015, 16 pgs.
(Continued)

*Primary Examiner* — Seahvosh Nikmanesh
(74) *Attorney, Agent, or Firm* — Schwabe, Williamson & Wyatt, P.C.

(57) ABSTRACT

Approaches for the foil-based metallization of solar cells and the resulting solar cells are described. In an example, a solar cell includes a substrate. A plurality of alternating N-type and P-type semiconductor regions is disposed in or above the substrate. A conductive contact structure is disposed above the plurality of alternating N-type and P-type semiconductor regions. The conductive contact structure includes a plurality of metal seed material regions providing a metal seed material region disposed on each of the alternating N-type and P-type semiconductor regions. A metal foil is disposed on the plurality of metal seed material
(Continued)

regions, the metal foil having anodized portions isolating metal regions of the metal foil corresponding to the alternating N-type and P-type semiconductor regions.

10 Claims, 8 Drawing Sheets

Related U.S. Application Data continuation of application No. 14/229,716, filed on Mar. 28, 2014, now Pat. No. 9,231,129.

(51) Int. Cl.
*H01L 31/028* (2006.01)
*H01L 31/05* (2014.01)

(56) References Cited

U.S. PATENT DOCUMENTS

| | | | |
|---|---|---|---|
| 8,637,340 | B2 | 1/2014 | Moslehi et al. |
| 8,766,090 | B2 | 7/2014 | Sewell et al. |
| 9,231,129 | B2 | 1/2016 | Harley et al. |
| 9,627,566 | B2 * | 4/2017 | Harley ............ H01L 31/0475 |
| 2004/0261834 | A1 | 12/2004 | Basore et al. |
| 2006/0213548 | A1 | 9/2006 | Bachrach et al. |
| 2008/0216887 | A1 | 9/2008 | Hacke et al. |
| 2010/0051085 | A1 | 3/2010 | Weidman et al. |
| 2010/0065116 | A1 | 3/2010 | Stancel et al. |
| 2010/0229928 | A1 | 9/2010 | Zuniga et al. |
| 2012/0204938 | A1 | 8/2012 | Hacke et al. |
| 2012/0240995 | A1 | 9/2012 | Coakley |
| 2013/0000715 | A1 | 1/2013 | Moslehi et al. |
| 2013/0112233 | A1 | 5/2013 | Coakley |
| 2013/0137244 | A1 | 5/2013 | Kramer et al. |
| 2014/0166098 | A1 | 6/2014 | Kian et al. |
| 2014/0318611 | A1 | 10/2014 | Moslehi et al. |
| 2015/0129030 | A1 | 5/2015 | Kapur et al. |
| 2015/0129031 | A1 | 5/2015 | Moslehi et al. |
| 2015/0280021 | A1 | 10/2015 | Harley et al. |
| 2017/0005206 | A1 | 1/2017 | Moslehi et al. |

FOREIGN PATENT DOCUMENTS

| | | |
|---|---|---|
| WO | WO-2013/115851 | 8/2013 |
| WO | 2015148573 A1 | 10/2015 |

OTHER PUBLICATIONS

J. Park et al., "Localized anodization of aluminum for the formation of Aluminum/Alumina patterns", Asian Symposium for Precision Engineering & Nanotechnology, 2009, 4 pgs.

D. A. Brevnov et al., "Fabrication of Patterned Arrays with Alternating Regions of Aluminum and Porous Aluminum Oxide", Electrochem, Solid-State Lett. 2005 vol. 8, Issue 1, C4-C5, 1 pg.

H. Jha et al., "Micro-patterning in anodic oxide film on aluminium by laser irradiation", Electrochimica Acta 52, 2007, 11 pgs.

International Preliminary Report on Patentability for PCT Patent Application No. PCT/US2015/022336 dated Oct. 6, 2016, 12 pgs.

Extended European Search Report from European Patent Application No. 15767731.1 dated Feb. 24, 2017, 6 pgs.

Notice of First Office Action from Chinese Patent Application No. 2015800079641 dated Sep. 20, 2017, 5 pgs.

Notice of First Office Action from Chilean Patent Application No. 02438-2016 dated Feb. 16, 2018, 9 pgs.

Chilean Office Action for Chilean Patent Application No. 2438-2016 dated May 18, 2018; 7 pgs.

* cited by examiner

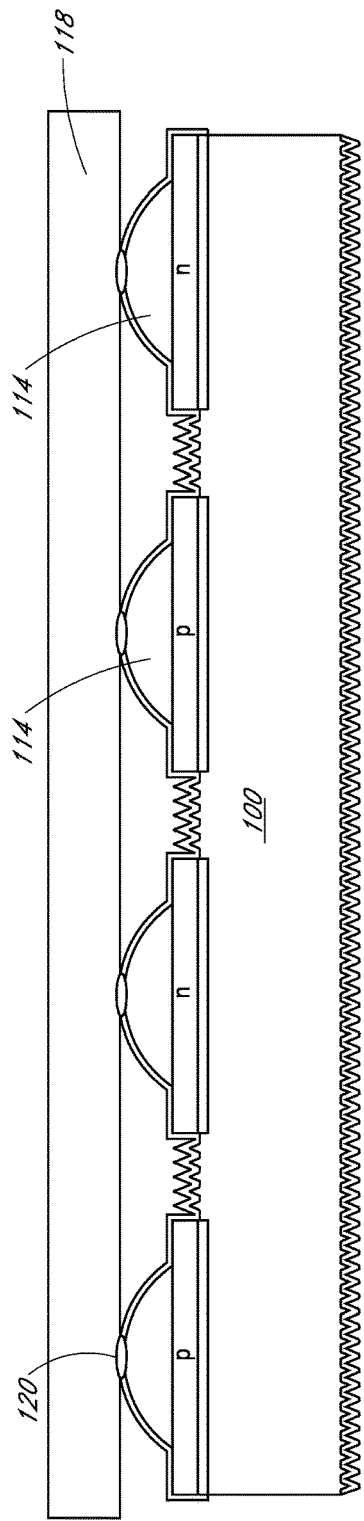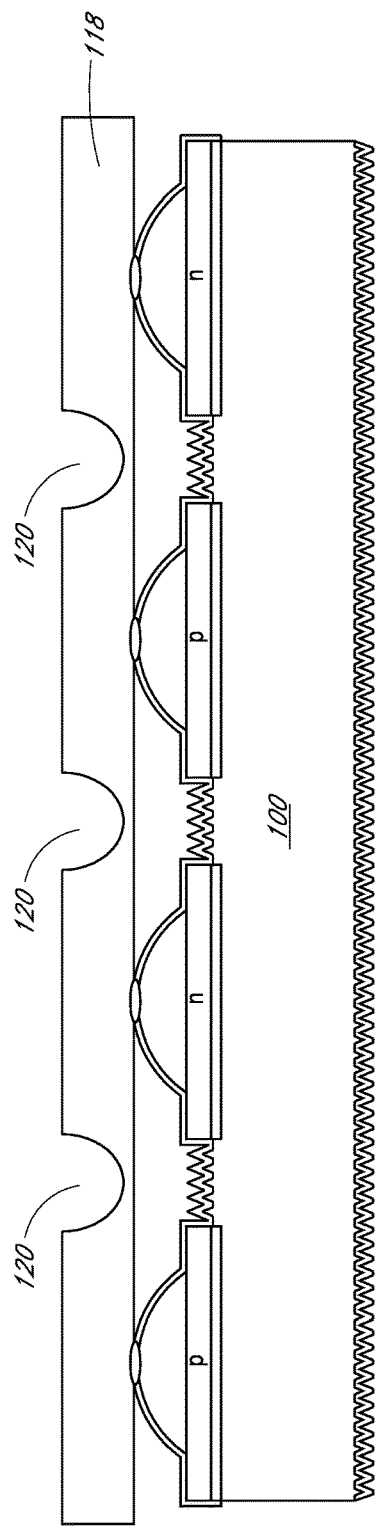

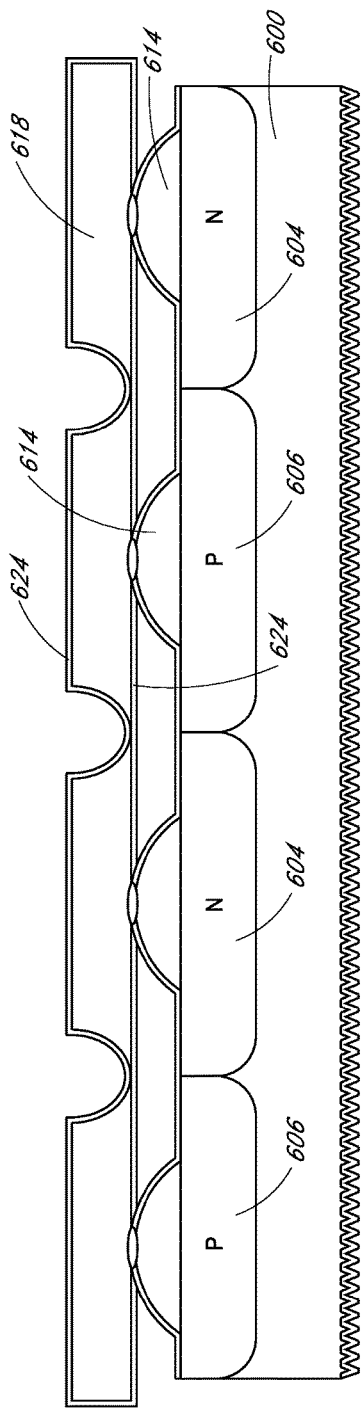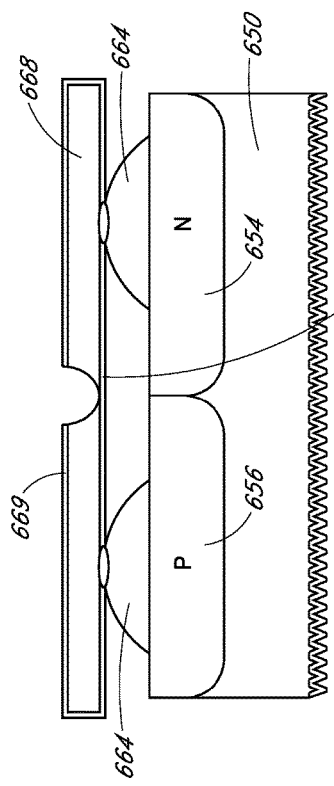

FOIL-BASED METALLIZATION OF SOLAR CELLS

CROSS-REFERENCE TO RELATED APPLICATIONS

This application is a continuation of U.S. patent application Ser. No. 14/954,030, filed on Nov. 30, 2015, which is a continuation of U.S. patent application Ser. No. 14/229,716, filed on Mar. 28, 2014, now U.S. Pat. No. 9,231,129, issued on Jan. 5, 2016, the entire contents of which are hereby incorporated by reference herein.

TECHNICAL FIELD

Embodiments of the present disclosure are in the field of renewable energy and, in particular, include approaches for foil-based metallization of solar cells and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 1A-1E illustrate cross-sectional views of various stages in the fabrication of a solar cell using foil-based metallization, in accordance with an embodiment of the present disclosure, wherein:

FIG. 1A illustrates a stage in solar cell fabrication following formation of optional metal seed regions on emitter regions formed above a portion of a back surface of a substrate of a solar cell;

FIG. 1B illustrates the structure of FIG. 1A following optional formation of a protection layer;

FIG. 1C illustrates the structure of FIG. 1B following adhering of a metal foil to a back surface thereof;

FIG. 1D illustrates the structure of FIG. 1C following formation of laser grooves in the metal foil; and FIG. 1E illustrates the structure of FIG. 1D following anodizing of exposed surfaces of the metal foil.

FIGS. 3A-3C illustrate cross-sectional views of various stages in the fabrication of a solar cell using foil-based metallization, in accordance with another embodiment of the present disclosure, wherein:

FIG. 3A illustrates a stage in solar cell fabrication involving placement of an anodized metal foil above optional metal seed regions formed on emitter regions formed above a portion of a back surface of a substrate of a solar cell;

FIG. 3B illustrates the structure of FIG. 3A following welding of the anodized metal foil to a back surface thereof; and FIG. 3C illustrates the structure of FIG. 3B following formation of laser grooves in the anodized metal foil.

FIG. 6A illustrates a cross-sectional view of a portion of a solar cell having foil-based contact structures formed on emitter regions formed in a substrate, in accordance with an embodiment of the present disclosure.

FIG. 6B illustrates a cross-sectional view of a portion of a solar cell having anodized foil-based contact structures formed on emitter regions formed in a substrate, in accordance with an embodiment of the present disclosure.

DETAILED DESCRIPTION

Figure 1A:
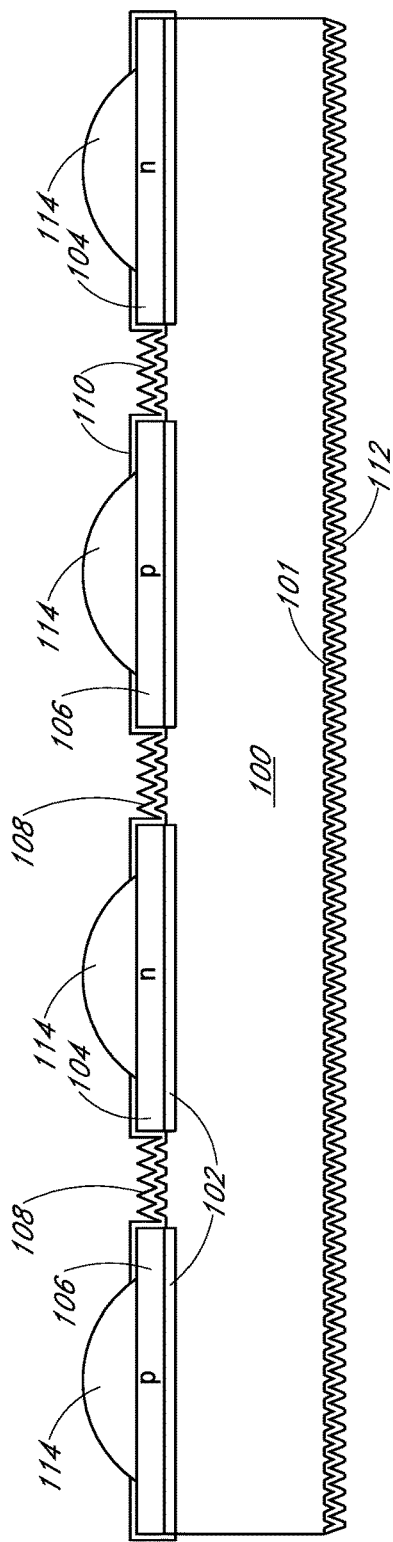

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Approaches for foil-based metallization of solar cells and the resulting solar cells are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell involves forming a plurality of alternating N-type and P-type semiconductor regions in or above a substrate. The method also involves adhering a metal foil to the alternating N-type and P-type semiconductor regions. The method also involves laser ablating through only a portion of the metal foil at regions corresponding to locations between the alternating N-type and P-type semiconductor regions. The method also involves, subsequent to the laser ablating, anodizing the remaining metal foil to isolate regions of the remaining metal foil corresponding to the alternating N-type and P-type semiconductor regions.

In another embodiment, a method of fabricating a solar cell involves forming a plurality of alternating N-type and P-type semiconductor regions in or above a substrate. The method also involves adhering an anodized metal foil to the alternating N-type and P-type semiconductor regions, the anodized metal foil having an anodized top surface and an anodized bottom surface with a metal portion there between. Adhering the anodized metal foil to the alternating N-type and P-type semiconductor regions involves breaking through regions of the anodized bottom surface of the anodized metal foil. The method also involves laser ablating through the anodized top surface and the metal portion of the anodized metal foil at regions corresponding to locations between the alternating N-type and P-type semiconductor regions. The laser ablating terminates at the anodized bottom surface of the anodized metal foil isolating regions of the remaining metal foil corresponding to the alternating N-type and P-type semiconductor regions.

Also disclosed herein are solar cells. In one embodiment, a solar cell includes a substrate. A plurality of alternating N-type and P-type semiconductor regions is disposed in or above the substrate. A conductive contact structure is disposed above the plurality of alternating N-type and P-type semiconductor regions. The conductive contact structure includes a plurality of metal seed material regions providing a metal seed material region disposed on each of the alternating N-type and P-type semiconductor regions. A metal foil is disposed on the plurality of metal seed material regions, the metal foil having anodized portions isolating metal regions of the metal foil corresponding to the alternating N-type and P-type semiconductor regions.

One or more embodiments described herein are directed to, metal (such as aluminum) anodization-based metallization for solar cells. In one embodiment, an aluminum metallization process for interdigitated back contact (IBC) solar cells is disclosed. In one embodiment, an anodizing and subsequent laser grooving approach is disclosed.

In a first aspect, a laser grooving and subsequent anodizing approach provides a new electrode patterning method for IBC solar cells based on the laser patterning and anodizing of an aluminum (Al) foil (which has been laser welded to the cell) to form an inter-digitated pattern of contact fingers. Embodiments of the first approach can be implemented to provide a damage-free method to patterning an Al foil on the wafer, avoiding complex alignment and/or masking processes.

Consistent with the above referenced first aspect, FIGS. 1A-1E illustrate cross-sectional views of various stages in the fabrication of a solar cell using foil-based metallization, in accordance with an embodiment of the present disclosure. FIG. 2 is a flowchart listing operations in a method of fabricating a solar cell as corresponding to FIGS. 1A-1E, in accordance with an embodiment of the present disclosure.

Figure 2:
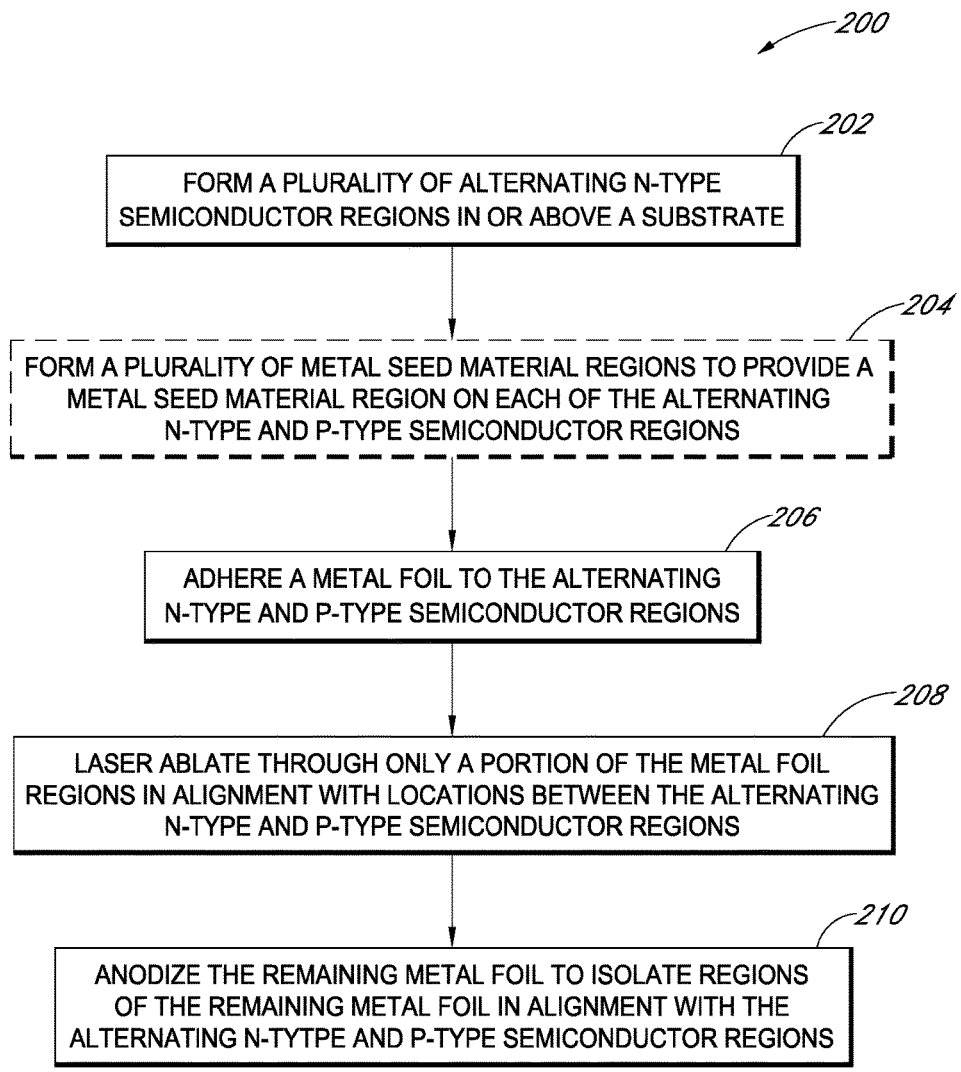
FIG. 2 is a flowchart listing operations in a method of fabricating a solar cell as corresponding to FIGS. 1A-1E, in accordance with an embodiment of the present disclosure.

FIG. 1A illustrates a stage in solar cell fabrication following formation of optional metal seed regions on emitter regions formed above a portion of a back surface of a substrate of a solar cell. Referring to FIG. 1A and corresponding operation 202 of flowchart 200, a plurality of alternating N-type and P-type semiconductor regions are formed above a substrate. In particular, a substrate 100 has disposed there above N-type semiconductor regions 104 and P-type semiconductor regions 106 disposed on a thin dielectric material 102 as an intervening material between the N-type semiconductor regions 104 or P-type semiconductor regions 106, respectively, and the substrate 100. The substrate 100 has a light-receiving surface 101 opposite a back surface above which the N-type semiconductor regions 104 and P-type semiconductor regions 106 are formed.

In an embodiment, the substrate 100 is a monocrystalline silicon substrate, such as a bulk single crystalline N-type doped silicon substrate. It is to be appreciated, however, that substrate 100 may be a layer, such as a multi-crystalline silicon layer, disposed on a global solar cell substrate. In an embodiment, the thin dielectric layer 102 is a tunneling silicon oxide layer having a thickness of approximately 2 nanometers or less. In one such embodiment, the term "tunneling dielectric layer" refers to a very thin dielectric layer, through which electrical conduction can be achieved.

The conduction may be due to quantum tunneling and/or the presence of small regions of direct physical connection through thin spots in the dielectric layer. In one embodiment, the tunneling dielectric layer is or includes a thin silicon oxide layer.

In an embodiment, the alternating N-type and P-type semiconductor regions 104 and 106, respectively, are formed polycrystalline silicon formed by, e.g., using a plasma-enhanced chemical vapor deposition (PECVD) process. In one such embodiment, the N-type polycrystalline silicon emitter regions 104 are doped with an N-type impurity, such as phosphorus. The P-type polycrystalline silicon emitter regions 106 are doped with a P-type impurity, such as boron. As is depicted in FIG. 1A, the alternating N-type and P-type semiconductor regions 104 and 106 may have trenches 108 formed there between, the trenches 108 extending partially into the substrate 100. Additionally, in one embodiment, a bottom anti-reflective coating (BARC) material 110 or other protective layer (such as a layer amorphous silicon) is formed on the alternating N-type and P-type semiconductor regions 104 and 106, as is depicted in FIG. 1A.

In an embodiment, the light receiving surface 101 is a texturized light-receiving surface, as is depicted in FIG. 1A. In one embodiment, a hydroxide-based wet etchant is employed to texturize the light receiving surface 101 of the substrate 100 and, possibly, the trench 108 surfaces as is also depicted in FIG. 1A. It is to be appreciated that the timing of the texturizing of the light receiving surface may vary. For example, the texturizing may be performed before or after the formation of the thin dielectric layer 102. In an embodiment, a texturized surface may be one which has a regular or an irregular shaped surface for scattering incoming light, decreasing the amount of light reflected off of the light receiving surface 101 of the solar cell. Referring again to FIG. 1A, additional embodiments can include formation of a passivation and/or anti-reflective coating (ARC) layers (shown collectively as layer 112) on the light-receiving surface 101. It is to be appreciated that the timing of the formation of passivation and/or ARC layers may also vary.

Referring again to FIG. 1A and now to corresponding optional operation 204 of flowchart 200, a plurality of metal seed material regions 114 is formed to provide a metal seed material region on each of the alternating N-type and P-type semiconductor regions 104 and 106, respectively. The metal seed material regions 114 make direct contact to the alternating N-type and P-type semiconductor regions 104 and 106.

In an embodiment, the metal seed regions 114 are aluminum regions. In one such embodiment, the aluminum regions each have a thickness approximately in the range of 0.3 to 20 microns and include aluminum in an amount greater than approximately 97% and silicon in an amount approximately in the range of 0-2%. In other embodiments, the metal seed regions 114 include a metal such as, but not limited to, nickel, silver, cobalt or tungsten.

Figure 1B:
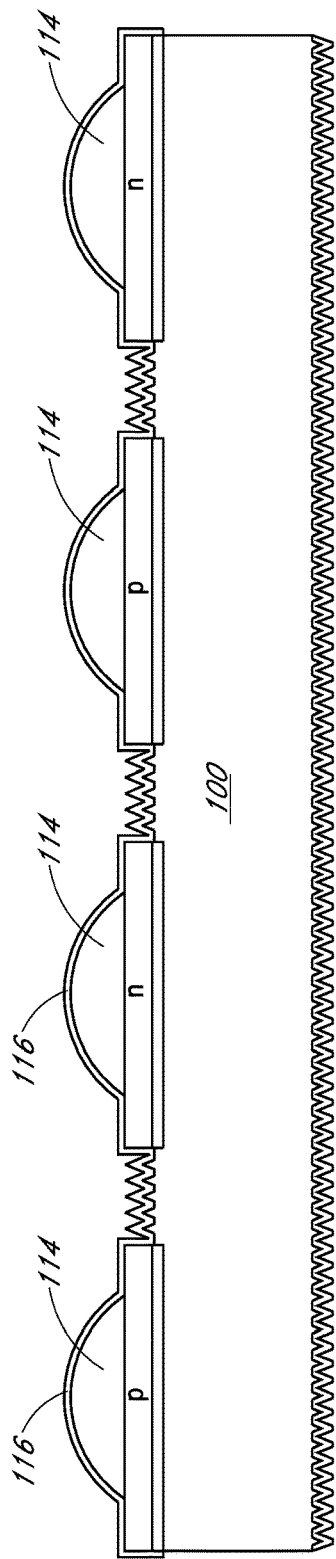

FIG. 1B illustrates the structure of FIG. 1A following optional formation of a protection layer. In particular, referring to FIG. 1B, an insulating layer 116 is formed on the plurality of metal seed material regions 114. In an embodiment, the insulating layer 116 is a silicon nitride of silicon oxynitride material layer.

FIG. 1C illustrates the structure of FIG. 1B following adhering of a metal foil to a back surface thereof. Referring to FIG. 1C and corresponding operation 206 of flowchart 200, a metal foil 118 is adhered to the alternating N-type and P-type semiconductor regions by directly coupling portions of the metal foil 118 with a corresponding portion of each of the metal seed material regions 114. In one such embodiment, the direct coupling of portions of the metal foil 118 with a corresponding portion of each of the metal seed material regions 114 involves forming a metal weld 120 at each of such locations, as is depicted in FIG. 1C. In another embodiment, in place of the metal seed regions 114, a blanket metal seed layer is used that is not patterned at this stage of processing. In that embodiment, the blanket metal seed layer may be patterned in a subsequent etching process, such as a hydroxide-based wet etching process.

In an embodiment, metal foil 118 is an aluminum (Al) foil having a thickness approximately in the range of 5-100 microns and, preferably, a thickness approximately in the range of 50-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated).

In an embodiment, the metal foil 118 is adhered directly to the plurality of metal seed material regions 114 by using a technique such as, but not limited to, a laser welding process, a thermal compression process or an ultrasonic bonding process. In an embodiment, the optional insulating layer 116 is included, and adhering the metal foil 118 to the plurality of metal seed material regions 114 involves breaking through regions of the insulating layer 116, as is depicted in FIG. 1C.

It is to be appreciated that, in accordance with another embodiment, a seedless approach may be implemented. In such an approach, metal seed material regions 114 are not formed, and the metal foil 118 is adhered directly to the material of the alternating N-type and P-type semiconductor regions 104 and 106. For example, in one embodiment, the metal foil 118 is adhered directly to alternating N-type and P-type polycrystalline silicon regions.

FIG. 1D illustrates the structure of FIG. 1C following formation of laser grooves in the metal foil. Referring to FIG. 1D and corresponding operation 208 of flowchart 200, the metal foil 118 is laser ablated through only a portion of the metal foil 118 at regions corresponding to locations between the alternating N-type and P-type semiconductor regions 104 and 106, e.g., above trench 108 locations as is depicted in FIG. 1D. The laser ablating forms grooves 122 that extend partially into, but not entirely through, the metal foil 118.

In an embodiment, forming laser grooves 122 involves laser ablating a thickness of the metal foil 118 approximately in the range of 80-99% of an entire thickness of the metal foil 118. That is, in one embodiment, it is critical that the lower portion of the metal foil 118 is not penetrated, such that metal foil 118 protects the underlying emitter structures.

In an embodiment, the laser ablation is performed mask-free; however, in other embodiments, a mask layer is formed on a portion of the metal foil 118 prior to laser ablating, and is removed subsequent to laser ablating. In one such embodiment, the mask is formed on either a portion of or on the entire foil area. In another embodiment, the mask is then left in place during the below described anodization process. In an embodiment, the mask is not removed at the end of the process. In another embodiment, however, the mask is not removed at the end of the process and is retained as a protection layer.

Figure 1E:
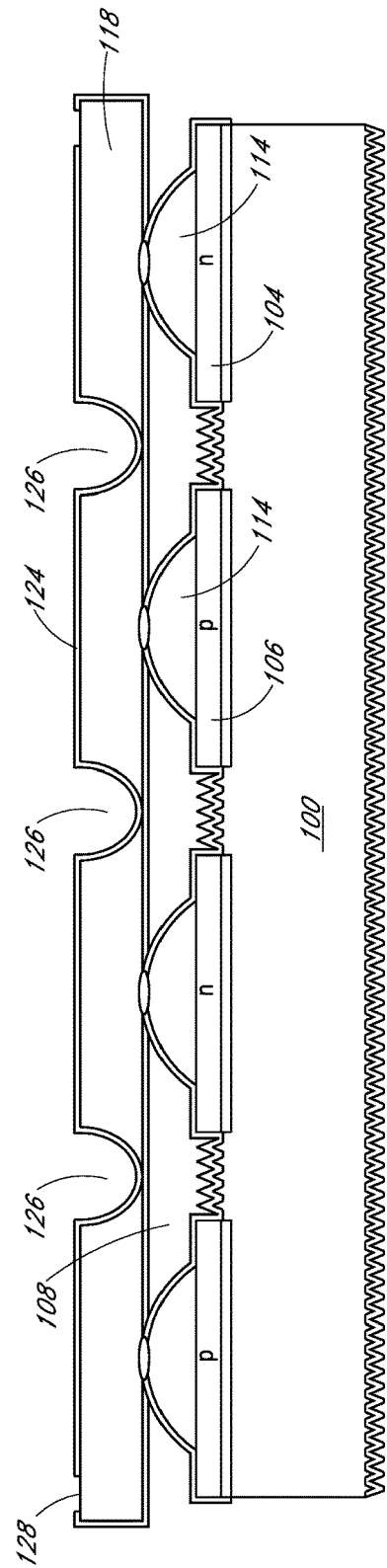

FIG. 1E illustrates the structure of FIG. 1D following anodizing of exposed surfaces of the metal foil. Referring to FIG. 1E and corresponding operation 210 of flowchart 200, the remaining metal foil 118 is anodized at exposed surfaces thereof to isolate regions of the remaining metal foil 118 corresponding to the alternating N-type and P-type semiconductor regions 104 and 106. In particular, the exposed surfaces of the metal foil 118, including the surfaces of the grooves 122, are anodized to form an oxide coating 124. At locations 126 corresponding to the alternating N-type and P-type semiconductor regions 104 and 106, e.g., in the grooves 122 at locations above the trenches 108, the entire remaining thickness of the metal foil 118 is anodized there through to isolate regions of metal foil 118 remaining above each of the N-type and P-type semiconductor regions 104 and 106.

In an embodiment, the metal foil 118 is an aluminum foil, and anodizing the metal foil involves forming aluminum oxide on the exposed and outermost portions of the remaining portions of the metal foil 118. In one such embodiment, anodizing the aluminum foil involves oxidizing exposed surfaces of the aluminum foil to a depth approximately in the range of 1-20 microns and, preferably to a depth approximately in the range of 5-20 microns. In an embodiment, in order to electrically isolate contacting portion of the metal foil 118, the portions of the metal foil 118 at the bottom of the laser grooves 122 are completely anodized, as is depicted in FIG. 1E. In an embodiment, openings 128 may be made in portions of the oxide coating 124, as is also depicted in FIG. 1E, to enable contact to certain regions of the metal foil 118.

With reference again to FIG. 1E, in another embodiment, instead of anodizing the metal foil to isolate portions of the metal foil, the patterned metal foil is etched to isolate portions of the metal foil. In one such embodiment, the structure of FIG. 1D is exposed to a wet etchant. Although the wet etchant etches all exposed portions of the metal foil, a carefully timed etch process is used to break through the bottoms of the laser grooves 122 without significantly reducing the thickness of the non-grooved regions of the metal foil. In a particular embodiment, a hydroxide based etchant is used, such as, but not limited to, potassium hydroxide (KOH) or tetramethylammonium hydroxide (TMAH).

In a second aspect, an anodizing and subsequent laser grooving approach involves the implantation of anodized foils using anodized aluminum oxide (AAO) as a laser landing zone. The landing zone is then retained to provide electrical insulation in the final solar cell.

Figure 3A:
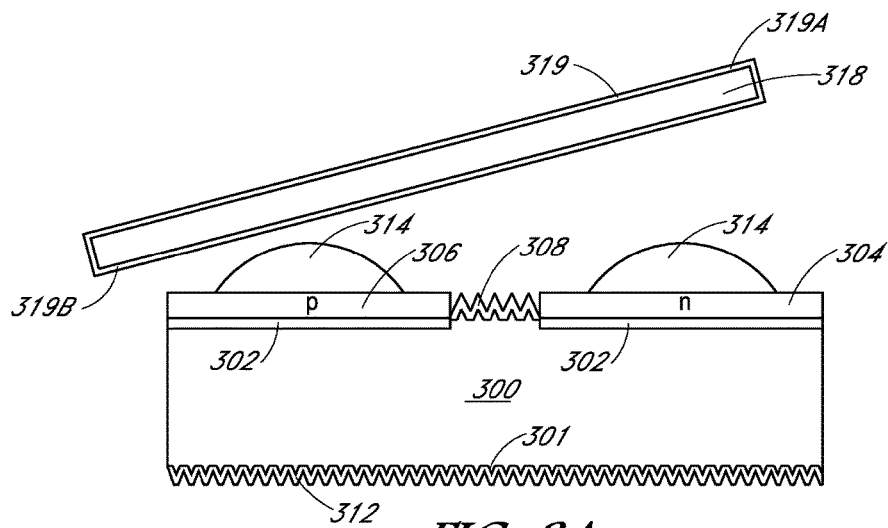
Figure 3B:
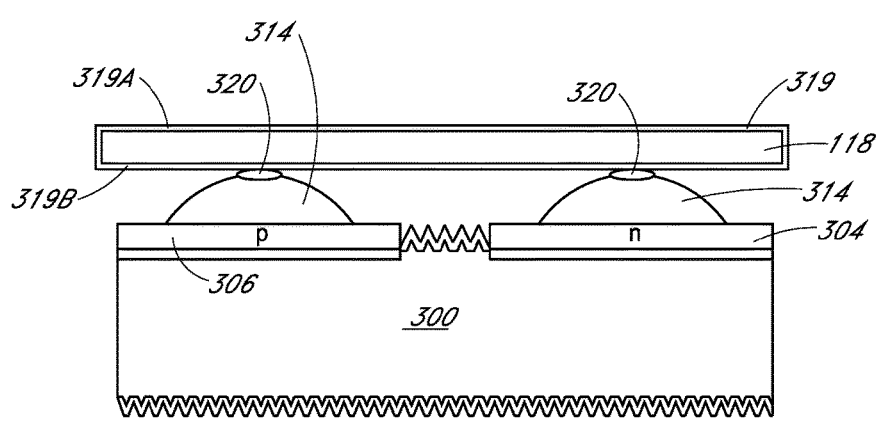
Figure 3C:
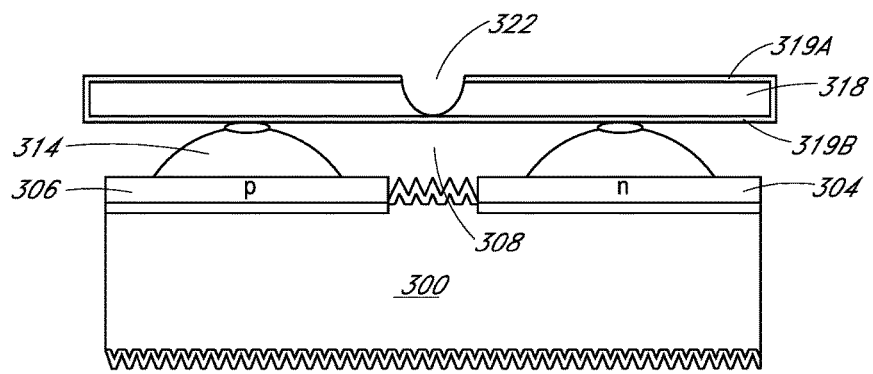
Figure 4:
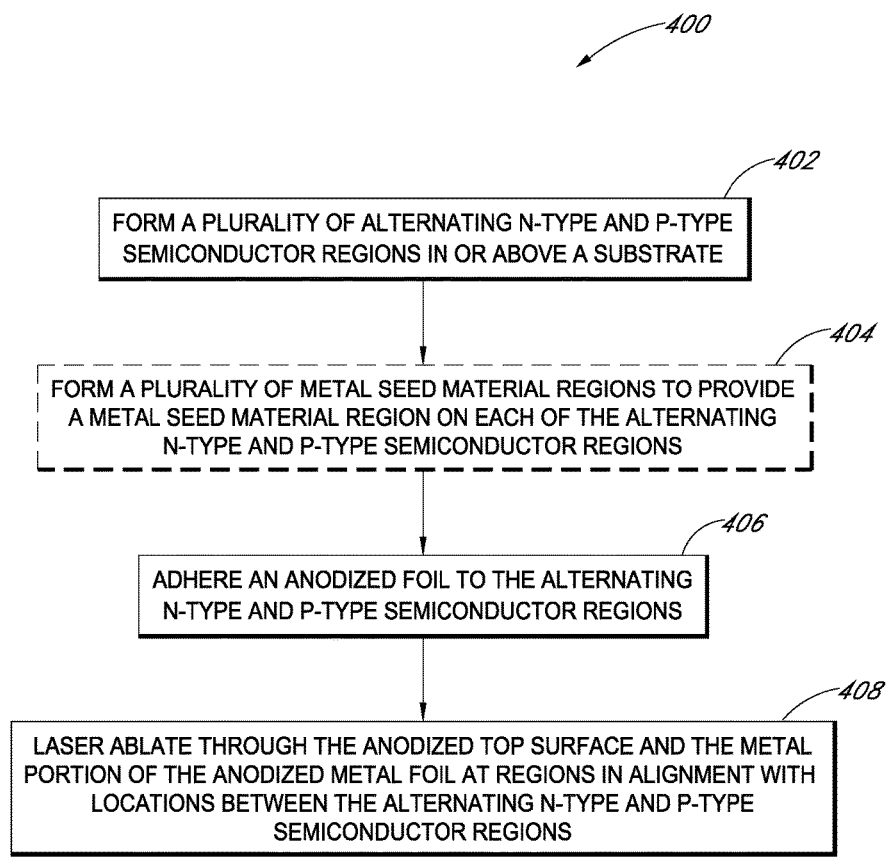
FIG. 4 is a flowchart listing operations in a method of fabricating a solar cell as corresponding to FIGS. 3A-3C, in accordance with an embodiment of the present disclosure.

Consistent with the above referenced second aspect, FIGS. 3A-3C illustrate cross-sectional views of various stages in the fabrication of a solar cell using foil-based metallization, in accordance with another embodiment of the present disclosure. FIG. 4 is a flowchart listing operations in a method of fabricating a solar cell as corresponding to FIGS. 3A-3C, in accordance with an embodiment of the present disclosure.

FIG. 3A illustrates a stage in solar cell fabrication involving placement of an anodized metal foil above optional metal seed regions formed on emitter regions formed above a portion of a back surface of a substrate of a solar cell. Referring to FIG. 3A and corresponding operation 402 of flowchart 400, a plurality of alternating N-type and P-type semiconductor regions are formed above a substrate. In particular, a substrate 300 has disposed there above N-type semiconductor regions 304 and P-type semiconductor regions 306 disposed on a thin dielectric material 302 as an intervening material between the N-type semiconductor regions 304 or P-type semiconductor regions 306, respectively, and the substrate 300. The substrate 300 has a light-receiving surface 301 opposite a back surface above which the N-type semiconductor regions 304 and P-type semiconductor regions 306 are formed.

In an embodiment, the substrate 300 is a monocrystalline silicon substrate, such as a bulk single crystalline N-type doped silicon substrate. It is to be appreciated, however, that substrate 300 may be a layer, such as a multi-crystalline silicon layer, disposed on a global solar cell substrate. In an embodiment, the thin dielectric layer 302 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, the alternating N-type and P-type semiconductor regions 304 and 306, respectively, are formed polycrystalline silicon formed by, e.g., using a plasma-enhanced chemical vapor deposition (PECVD) process. In one such embodiment, the N-type polycrystalline silicon emitter regions 304 are doped with an N-type impurity, such as phosphorus. The P-type polycrystalline silicon emitter regions 306 are doped with a P-type impurity, such as boron. As is depicted in FIG. 3A, the alternating N-type and P-type semiconductor regions 304 and 306 may have trenches 308 formed there between, the trenches 308 extending partially into the substrate 300.

In an embodiment, the light receiving surface 301 is a texturized light-receiving surface, as is depicted in FIG. 3A. In one embodiment, a hydroxide-based wet etchant is employed to texturize the light receiving surface 301 of the substrate 300 and, possibly, the trench 308 surfaces as is also depicted in FIG. 3A. It is to be appreciated that the timing of the texturizing of the light receiving surface may vary. For example, the texturizing may be performed before or after the formation of the thin dielectric layer 302. In an embodiment, a texturized surface may be one which has a regular or an irregular shaped surface for scattering incoming light, decreasing the amount of light reflected off of the light receiving surface 301 of the solar cell. Referring again to FIG. 3A, additional embodiments can include formation of a passivation and/or anti-reflective coating (ARC) layers (shown collectively as layer 312) on the light-receiving surface 301. It is to be appreciated that the timing of the formation of passivation and/or ARC layers may also vary.

Referring again to FIG. 3A and now to corresponding optional operation 404 of flowchart 400, a plurality of metal seed material regions 314 is formed to provide a metal seed material region on each of the alternating N-type and P-type semiconductor regions 304 and 306, respectively. The metal seed material regions 314 make direct contact to the alternating N-type and P-type semiconductor regions 304 and 306.

In an embodiment, the metal seed regions 314 are aluminum regions. In one such embodiment, the aluminum regions each have a thickness approximately in the range of 0.3 to 20 microns and include aluminum in an amount greater than approximately 97% and silicon in an amount approximately in the range of 0-2%. In other embodiments, the metal seed regions 314 include a metal such as, but not limited to, nickel, silver, cobalt or tungsten.

Referring again to FIG. 3A, an anodized metal foil 318 is positioned above the metal seed regions 314. In an embodiment, the anodized metal foil 318 is an anodized aluminum foil having a coating 319 of aluminum oxide formed thereon. In one such embodiment, the anodized aluminum foil 318 has a total thickness approximately in the range of 5-100 microns, and preferably in the range of 50-100 microns, with the anodized top surface 319A and anodized bottom surface 319B each contributing a thickness approximately in the range of 1-20 microns, and preferably in the range of 5-20 microns. Thus, in an embodiment, the anodized metal foil 318 has an anodized top surface (coating 319A) and an anodized bottom surface (coating 319B) with a conductive metal portion there between. In an embodiment, the anodized metal foil 318 is an anodized aluminum alloy foil including aluminum and second element such as, but not limited to, copper, manganese, silicon, magnesium, zinc, tin, lithium, or combinations thereof. In an embodiment, the anodized metal foil 318 is a temper grade anodized aluminum foil such as, but not limited to, F-grade (as fabricated), O-grade (full soft), H-grade (strain hardened) or T-grade (heat treated).

FIG. 3B illustrates the structure of FIG. 3A following welding of the anodized metal foil to a back surface thereof. Referring to FIG. 3B and corresponding operation 406 of flowchart 400, the anodized metal foil 318 is adhered to the alternating N-type and P-type semiconductor regions 304 and 306 by directly coupling portions of the anodized metal foil 318 with a corresponding portion of each of the metal seed material regions 314. In one such embodiment, the direct coupling of portions of the anodized metal foil 318 with a corresponding portion of each of the metal seed material regions 314 involves forming a metal weld 320 at each of such locations, as is depicted in FIG. 3B. In a particular embodiment, the anodized metal foil 318 is flattened on the back surface with a vacuum system and laser-welded on the metal seed layer following a matrix of spot welds.

In an embodiment, the anodized metal foil 318 is adhered to the plurality of metal seed material regions 314 by using a technique such as, but not limited to, a laser welding process, a thermal compression process or an ultrasonic bonding process. In an embodiment, adhering the anodized metal foil 318 to the plurality of metal seed material regions 314 involves breaking through the bottom surface oxide coating 319B, as is depicted in FIG. 3B.

In one embodiment (not shown, but similar to the description of FIG. 1B), prior to adhering the anodized metal foil 318 to the plurality of metal seed material regions 314, an insulating layer is formed on the plurality of metal seed material regions 314. In that embodiment, adhering the anodized metal foil 314 to the plurality of metal seed material regions 314 involves breaking through intervening regions of the insulating layer.

It is to be appreciated that, in accordance with another embodiment, a seedless approach may be implemented. In such an approach, metal seed material regions 314 are not formed, and the anodized metal foil 318 is adhered directly to the material of the alternating N-type and P-type semiconductor regions 304 and 306. For example, in one embodiment, the anodized metal foil 318 is adhered directly to alternating N-type and P-type polycrystalline silicon regions. In one such embodiment, the process involves breaking through the bottom surface oxide coating 319B.

FIG. 3C illustrates the structure of FIG. 3B following formation of laser grooves in the anodized metal foil. Referring to FIG. 3C and corresponding operation 408 of flowchart 400, the anodized metal foil 318 is laser ablated through the anodized top surface 319A and the central metal portion of the anodized metal foil 318 at regions corresponding to locations between the alternating N-type and P-type semiconductor regions 304 and 306, e.g., above trench 308 locations as is depicted in FIG. 3C. The laser ablating terminates at the anodized bottom surface 319B of the anodized metal foil 318, isolating regions of the remaining metal foil 318 corresponding to the alternating N-type and P-type semiconductor regions.

As such, the laser ablating forms grooves 322 that extend partially into, but not entirely through, the anodized metal foil 318. In an embodiment, it is critical that the anodized bottom surface 319B of the anodized metal foil 318 is not penetrated, such that anodized metal foil 318 protects the underlying emitter structures. Thus, the groove depth is accurately controlled to land in the bottom oxide layer of the anodized Al foil without cutting it fully. In an embodiment, the laser ablation is performed mask-free; however, in other embodiments, a mask layer is formed on a portion of the anodized metal foil 318 prior to laser ablating, and is removed subsequent to laser ablating.

In an embodiment, the approach described in association with FIGS. 3A-3C further involves, prior to adhering the anodized metal foil 318 to the alternating N-type and P-type semiconductor regions 304 and 306, forming a laser reflecting or absorbing film on the anodized bottom surface 319B of the anodized metal foil 318. In one such embodiment, the laser ablating involves using an infra-red (IR) laser, and forming the laser reflecting or absorbing film involves forming a magenta film. More generally, it is to be appreciated that embodiments involve the use of a film color that is designed in accordance with the laser being used. In such an approach, the film color is selected to target reflection or ablation. In the particular embodiment described, use of a magenta film means it absorbs green and reflects blue and red. In an embodiment, a top film that is transparent to the laser light is applied to the upper surface of the anodized metal foil. However, a reflecting film is applied to the bottom surface of the anodized metal foil. In another embodiment, the bottom surface is a dyed anodized aluminum oxide layer that can absorb approximately or greater than 85% of a laser pulse.

Referring again to FIG. 3C, a laser is used to finally pattern the anodized Al foil by forming grooves that follow an inter-digitated pattern, which may be either parallel or perpendicular to the seed pattern. The above illustration demonstrates both a general approach and can be applicable directly for parallel grooving. In another embodiment, the insulating surfaces of an anodized Al foil can be a benefit within coarse metal two (M2) approaches, i.e., for perpendicular grooving, to contact only fingers of a chosen polarity. In one such embodiment, the anodic aluminum oxide layer on the bottom of the foil prevents shunting between fingers of opposite polarities and electrical contacts are fabricated from spot welds only.

Figure 5:
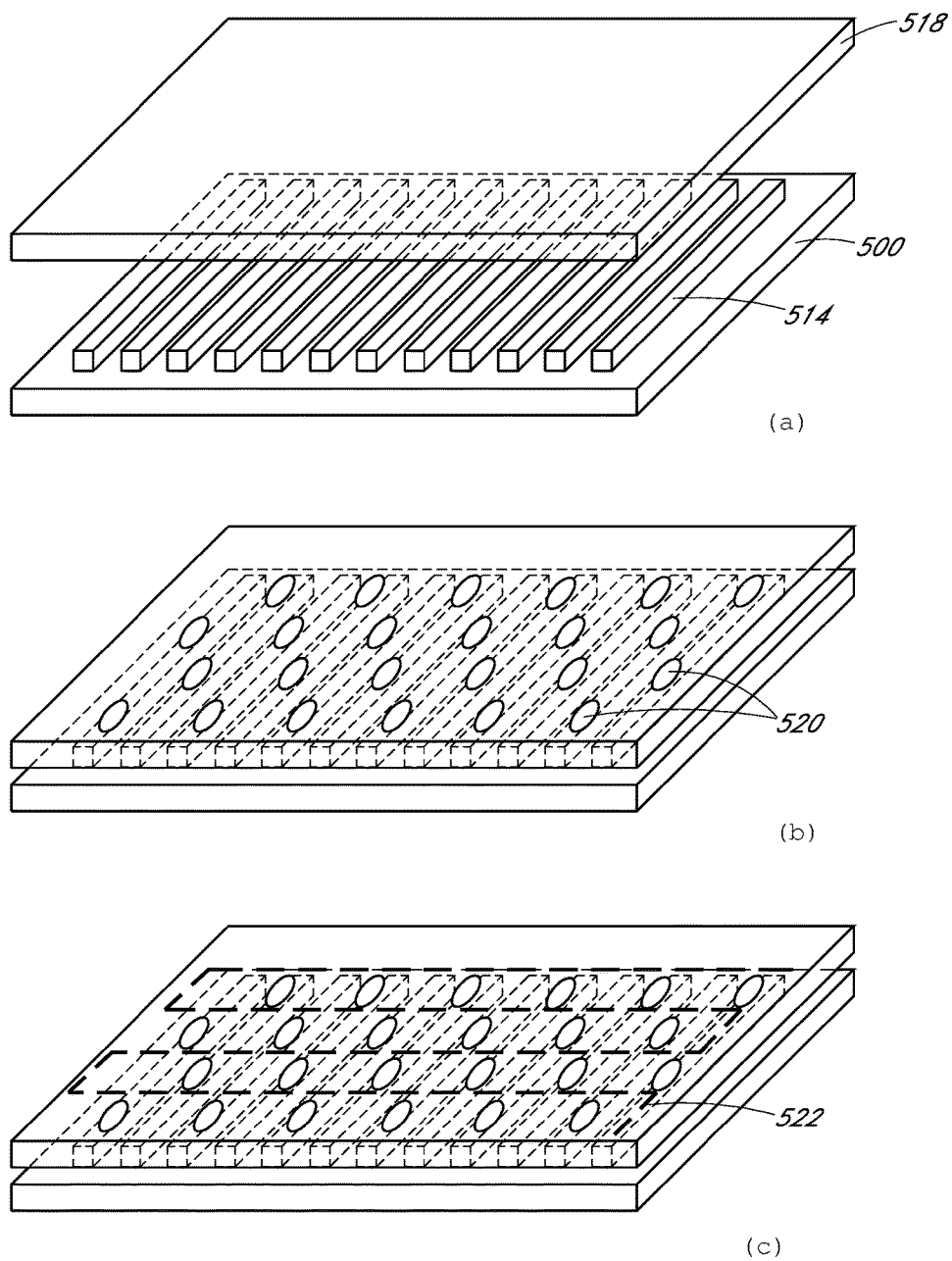
FIG. 5 illustrates cross-sectional views of various stages in the fabrication of another solar cell using anodized foil-based metallization, in accordance with another embodiment of the present disclosure.

FIG. 5 illustrates cross-sectional views of various stages in the fabrication of another solar cell using anodized foil-based metallization, in accordance with another embodiment of the present disclosure. Referring to part (a) of FIG. 5, an anodized aluminum foil 518 is fit-up with substrate 500 having a plurality of metal seed regions 514 disposed thereon. Referring to part (b) of FIG. 5, laser welding is performed to generate weld spots 520 adhering the foil 518 to the metal seed region 514. Referring to part (c) of FIG. 5, laser patterning is performed to provide laser grooves 522. In one embodiment, the pattern of the grooves is perpendicular to the pattern of the metal seed regions 514. In one embodiment, the laser ablation stops on an anodized bottom surface of the metal foil 518.

Embodiments described herein can be used to fabricate solar cells. In some embodiments, referring to FIGS. 1E and 3C, a solar cell includes a plurality of alternating N-type (104 or 304) and P-type (106 or 306) semiconductor regions disposed above A substrate 100 or 300. A conductive contact structure is disposed above the plurality of alternating N-type and P-type semiconductor regions. The conductive contact structure includes a plurality of metal seed material regions 114 or 314 providing a metal seed material region disposed on each of the alternating N-type and P-type semiconductor regions. A metal foil 118 or 318 is disposed on the plurality of metal seed material regions. The metal foil 118 or 318 has anodized portions 124 or 319 isolating metal regions of the metal foil 118 or 318 corresponding to the alternating N-type and P-type semiconductor regions. In one such embodiment, all exposed surfaces of the metal foil 118 or 113 are anodized. However, in another embodiment, openings (e.g., 128) may be formed in the anodized portion for metal contact, such as described in association with FIG. 1E. In yet another embodiment, the foil is anodized prior to laser ablation, and a subsequent anodizing is not performed. In that embodiment, the laser grooves 322 may have non-anodized surfaces exposed, as is depicted in FIG. 3C. In an embodiment, the substrate 100 or 300 is an N-type monocrystalline silicon substrate, and the plurality of alternating N-type (104 or 304) and P-type (106 or 306) semiconductor regions is disposed in a polycrystalline silicon material disposed above the substrate.

In yet other embodiment, the substrate is a monocrystalline silicon substrate, the alternating N-type and P-type semiconductor regions are formed in the monocrystalline silicon substrate. In a first example, FIG. 6A illustrates a cross-sectional view of a portion of a solar cell having foil-based contact structures formed on emitter regions formed in a substrate, in accordance with an embodiment of the present disclosure. Referring to FIG. 6A, a solar cell includes a plurality of alternating N-type 604 and P-type 606 semiconductor regions disposed in a substrate 600. A conductive contact structure is disposed above the plurality of alternating N-type and P-type semiconductor regions. The conductive contact structure includes a plurality of metal seed material regions 614 providing a metal seed material region disposed on each of the alternating N-type and P-type semiconductor regions. A metal foil 618 is disposed on the plurality of metal seed material regions 614. The metal foil 618 has anodized portions 624 isolating metal regions of the metal foil 618 corresponding to the alternating N-type and P-type semiconductor regions 604 and 606, respectively.

In a second example, FIG. 6B illustrates a cross-sectional view of a portion of a solar cell having anodized foil-based contact structures formed on emitter regions formed in a substrate, in accordance with an embodiment of the present disclosure. Referring to FIG. 6B, a solar cell includes a plurality of alternating N-type 654 and P-type 656 semiconductor regions disposed in a substrate 650. A conductive contact structure is disposed above the plurality of alternating N-type and P-type semiconductor regions. The conductive contact structure includes a plurality of metal seed material regions 664 providing a metal seed material region disposed on each of the alternating N-type and P-type semiconductor regions. A metal foil 668 is disposed on the plurality of metal seed material regions 664. The metal foil 668 has anodized portions 669 isolating metal regions of the metal foil 668 corresponding to the alternating N-type and P-type semiconductor regions 664 and 666, respectively.

In another aspect of the present disclosure, other embodiments building on the concepts described in association with the above exemplary embodiments are provided. As a most general consideration, back contact solar cells typically require patterned metal of two types of polarity on the backside of the solar cell. Where pre-patterned metal is not available due to cost, complexity, or efficiency reasons, low cost, low materials processing of a blanket metal often favors laser-based pattern approaches.

For high efficiency cells, patterned metal on the back of the cell typically have two requirements: (1) complete isolation of the metal, and (2) damage free-processing. For mass-manufacturing, the process may needs to also be a high-throughput process, such as greater than 500 wafers an hour throughput. For complex patterns, using a laser to pattern thick (e.g., greater than 1 micron) or highly reflective metal (e.g., aluminum) on top of silicon can poses a substantial throughput problem in manufacturing. Throughput issues may arise because the energy necessary to ablate a thick and/or highly reflective metal at a high rate requires a laser energy that is above the damage threshold of an underlying emitter (e.g., greater than 1 $J/cm^2$). Due to the necessity to have the metal completely isolated and the variation in metal thickness and laser energy, over-etching is often implemented for metal patterning. In particular, there appears to be no single laser-energy window at high-throughput/low cost available to completely remove metal and not expose the emitter to a damaging laser beam.

In accordance with embodiments of the present disclosure, various approaches to metal patterning are described. Furthermore, it is to be appreciated that, due to the interaction of the patterning process with the metal bonding process, it is important to also consider bonding approaches for bonding a first or seed metal layer (M1) to an upper metal layer such as a foil (M2). As described in greater detail below, some bonding approaches enable various patterning options.

In an embodiment, different strengths of adhesion among foil (M2) bonded to a vapor deposited thin seed metal (M1) and, hence, to the underlying device wafer, are achieved depending on bonding method. Furthermore, different types of failures modes are observed during the adhesion test. For laser bonding, adhesion can depend on the laser fluence (energy per focused area). At lower fluences, the adhesion between M1 and M2 is too weak and the M2 detaches easily. As the laser fluence increases, the adhesion by the welding between the foil and the underlying M1 seed layer becomes strong enough to tear the foil during the adhesion test. When the laser fluence becomes even higher, the underlying M1 layer becomes affected and the M1-device wafer bonding is broken before the foil is torn off in a peeling test. To take advantage of such different modes of tearing, in one embodiment, a spatially shaped laser beam is used during the laser bonding process. The laser beam can have higher intensity (M1 tearing range) at the outer region and lower intensity (M2 tearing range) on the inside, such that after the welding, the foil (M2) can be torn off along with the M1, while leaving the M2/M1 region under the weld intact.

In another aspect, where wet chemical etchants are used to complete the isolation following a groove, the M1 may be exposed for long periods to the etchant. During that time, undesirable etching may occur, or the chemistry may get trapped between M1 and M2 if M1 and M2 are not completely bonded together. In both scenarios, if the aluminum foil is bonded to the metal seed layer using a non-continuous bonding method along the metal fingers (e.g., low density of bonds, such as one bond every 10 millimeters), the etching solution can penetrate at the foil/metal seed interface and induce the undesired etching of M1 fingers and/or the attack of M1/M2 bonds, resulting in poor device performance. Bonding approaches can include laser welding, local thermo-compression, soldering and ultra-sonic bonding. Thus, not all bonding methods are compatible with etch based patterning and, in particular, any low-density bonding approaches such as laser welding, can become particularly challenging.

In an embodiment, approaches described can be implemented to solve the above described issues associated with wet chemical etchants by protecting the M1 layer against chemical attack and allow for the use of etching-based patterning processes. Embodiments may include the use of laser welding as a bonding method, and laser grooving followed by chemical etching as a patterning method, but the concepts can be applicable to other non-linear bonding methods and chemical etching-based patterning methods.

In a first such embodiment, a blanket protective layer is deposited either on the substrate after metal seed deposition, or on the foil before the laser welding process. Material choice and layer thickness ensures that laser welding can be achieved through the protective layer. The material may be resistant against the chemical etching treatment (e.g., KOH solution). Examples of suitable materials include, but are not limited to, adhesives, silicones, polymers, or thin dielectrics. In a second such embodiment, a thin capping layer (e.g., approximately 100 nanometers in thickness) is deposited on top of a metal seed layer. The thin capping layer is composed of a different metal (e.g., Ni) and is resistant against the chemical etching solution. In a specific embodiment, the thin capping layer is compatible with a laser welding process between M1 and M2. In a third such embodiment, fingers of an etching resistant material (similar to the first embodiment) are printed in between M1 fingers and a thermal treatment is applied, before or after laser welding, to ensure continuous adhesion between the protective fingers and the M2 foil. In a specific embodiment, heat generated by the laser process is ultimately used to bond the protective material fingers to the M2 layer. The interface between the foil and the fingers acts as a barrier against the etching solution. The material may be thin and/or soft enough not to affect the foil fit-up and laser welding process (e.g., an intimate M1/M2 contact is needed).

In a first exemplary process flow, a grooving and etching approach involves deposition of M1 (e.g., deposition of a seed conductive layer capable of bonding with M2) to the device side of the solar cell. A M2 layer is the applied on the M1/cell and maintains contact suitable for bonding. Energy for bonding, e.g., thermo-compression or laser energy (e.g., long pulse duration (greater than 100 micro-seconds), is applied to locally heat the M2, and bond M1 and M2. A groove is then formed mechanically or by another laser process (e.g., shorter pulse duration, less than approximately 1 micro-second) to provide a deep groove (e.g., greater than approximately 80% of the foil thickness) and to trim the foil from the foil applicator. Isolation of conductive regions is then achieved, e.g., by applying etching media to the structure and selectively etching the remaining portion of the M2. In one embodiment, in order to increase the selectivity, a pre-patterned M1 layer is selected to provide etch resistance to the etching media, e.g., such as Ni metal resistant to KOH etching. Potential M2 materials include, but are not limited to, aluminum, nickel, copper, titanium, chromium or multilayer combinations thereof. With an aluminum M1 layer, the etching media may include an alkaline chemistry such as potassium hydroxide or acidic chemistry such as a phosphoric acid or a mixture of phosphoric and nitric acids. The etching media is then thoroughly rinsed off from the wafer to complete the etching reaction and avoid leaving chemical residues on the wafer. Horizontal spray rinses and/or sonic agitation may be utilized to fully remove chemistry from wafer.

In a second exemplary process flow, double step patterning is used based on high power laser grooving plus low power laser isolation. The method first involves deposition of M1 (e.g., a seed conductive layer suitable to laser weld with M2) on the device side of the solar cell and patterning of the deposited M1 layer. An M2 layer is then applied on the M1/cell and maintains direct contact suitable for laser welding. A highly energetic beam (e.g., long pulse duration (greater than approximately 100 microseconds) laser or electron beam) is applied to locally heat the M2, and to bond M1 and M2. An additional laser (e.g., shorter pulse duration, less than approximately 1 micro-second) is applied to provide a deep groove (e.g., greater than approximately 80% of the foil thickness) and to trim the foil from the foil applicator. A second low power laser is then applied along the laser groove to isolate the remaining M2.

It is to be appreciated that grooving may be achieved through other approaches. For example, in another embodiment, instead of using a laser process, the above described grooving is formed with a mechanical process such as, but not limited to, an array of hard-tipped cutting tools dragged across the surface, kissing cutting, CNC milling, ion milling, or other cutting type mechanism.

It is to be appreciated that remaining metal may be removed through other approaches. For example, in another embodiment, following the groove formation, the remaining metal is removed through use of electricity, such as with high currents, to burn-off the remaining metal by resistive heating. In another embodiment, following the groove formation, the remaining metal is removed via a very soft/low throughput laser ablation. In another embodiment, following the groove formation, the remaining metal is removed via other etching, such as plasma etching, or back-sputter etching. In another embodiment, following the groove formation, the remaining metal is removed by grasping or adhering to the metal region to be removed, and then "tearing off" the grasped or adhered section.

In a first specific embodiment of the tearing approach to remaining metal removal, two parallel grooves are formed, leaving a strip of metal to be torn, the strip having a width approximately in the range of 100 to 500 microns. In a second specific embodiment, the groove lines are extended outside of the solar cell to be used as tearing initiation points for the subsequent tearing procedure. In a third specific embodiment, prior to grooving, an M1/M2 bonding method is used, e.g., laser welding spot (or lines), thermo-compression bonding, or other, that provides a stronger adhesion than the shear strength of the M2 foil that is ultimately torn. In a fourth specific embodiment, a laser beam shape of a laser groove, or of the laser bonding laser, is used to modify the mechanical properties of the metal, e.g., through adjustment of the beam profile to tailor a cooling profile and modify the grain-structure based on time and temperature. In this way, a post-groove isolation process is facilitated. In one such embodiment, a Gaussian beam is distorted in shape to invert the peak such that the edge profile has higher energy and is used to form a line weld. The higher-local heating at the edge of the bond causes larger stress and changes the cooling profile, and the edge of the welded material has either a lower yield strength than the bulk, or is less ductile. In this case, during a tear process, the interface is the first to fail. In each of the above four embodiments, that the metal seed layer can be patterned before grooving, or patterned after grooving, preferably along with the post-grooving isolation described above.

In other embodiments, the M1 layer is protected from etchants through use of a capping layer, such as Ni, polymer, oxide, or thin adhesive deposited on M1, or M2, with a thickness or composition compatible with the welding process (e.g., less than approximately 10 microns for welding through a polymer). In other embodiments, bonding is achieved with a suitably high density (e.g., 100% as view from top down) to protect from penetration of an etchant into gaps, and to avoid over-etching of the M1. The bonding may be effected via integration with the bulk M2 (e.g., linear welding, thermo-compression bonding).

Although certain materials are described specifically above with reference to FIGS. 1A-1E, 3A-3C, 56A and 6B and to other described embodiments, some materials may be readily substituted with others with other such embodiments remaining within the spirit and scope of embodiments of the present disclosure. For example, in an embodiment, a different material substrate, such as a group III-V material substrate, can be used instead of a silicon substrate. In other embodiment, the above described approaches can be applicable to manufacturing of other than solar cells. For example, manufacturing of light emitting diode (LEDs) may benefit from approaches described herein.

Thus, approaches for foil-based metallization of solar cells and the resulting solar cells have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
a substrate;
a plurality of semiconductor regions above a surface of the substrate, wherein individual ones of the plurality of semiconductor regions are separated from one another by a corresponding one of a first plurality of regions; and
a plurality of metal foil portions above and electrically connected to the plurality of semiconductor regions, wherein individual ones of the plurality of metal foil portions correspond to individual ones of the plurality of semiconductor regions, wherein individual ones of the plurality of metal foil portions are separated from one another by a corresponding one of a second plurality of regions, and wherein the second plurality of regions is substantially aligned with the first plurality of regions over the surface of the substrate.

2. The solar cell of claim 1, wherein the plurality of metal foil portions is a plurality of aluminum foil portions.

3. The solar cell of claim 1, further comprising:
a plurality of metal seed material regions on the plurality of semiconductor regions, wherein individual ones of the plurality of metal seed material regions correspond to individual ones of the plurality of semiconductor regions, wherein the plurality of metal foil portions is on the plurality of metal seed material regions, and wherein individual ones of the plurality of metal foil portions correspond to individual ones of the plurality of metal seed material regions.

4. The solar cell of claim 3, wherein the plurality of metal seed material regions comprises aluminum.

5. The solar cell of claim 4, wherein the plurality of metal foil portions is a plurality of aluminum foil portions.

6. The solar cell of claim 2, wherein the plurality of metal foil portions is spot welded to the plurality of metal seed material regions.

7. The solar cell of claim 1, wherein at least a portion of outer surfaces of the plurality of metal foil portions is anodized.

8. The solar cell of claim 7, wherein all exposed outer surfaces of the plurality of metal foil portions are anodized.

9. The solar cell of claim 1, wherein exposed outer surfaces of the plurality of metal foil portions are not anodized.

10. The solar cell of claim 1, wherein the plurality of semiconductor regions comprises polycrystalline silicon.

* * * * *